United States Patent
Bucci et al.

(10) Patent No.: US 10,851,459 B2
(45) Date of Patent: Dec. 1, 2020

(54) DICHLOROSILANE COMPENSATING CONTROL STRATEGY FOR IMPROVED POLYCRYSTALLINE SILICON GROWTH

(71) Applicant: Hemlock Semiconductor Corporation, Hemlock, MI (US)

(72) Inventors: John Victor Bucci, Midland, MI (US); Mark Richard Stachowiak, Midland, MI (US); Charles Allan Stibitz, Midland, MI (US)

(73) Assignee: HEMLOCK SEMICONDUCTOR OPERATIONS LLC, Hemlock, MI (US)

( * ) Notice: Subject to any disclaimer, the term of this patent is extended or adjusted under 35 U.S.C. 154(b) by 8 days.

(21) Appl. No.: 15/242,740

(22) Filed: Aug. 22, 2016

(65) Prior Publication Data

US 2017/0058403 A1    Mar. 2, 2017

Related U.S. Application Data

(60) Provisional application No. 62/208,967, filed on Aug. 24, 2015.

(51) Int. Cl.
  *C23C 16/24*    (2006.01)
  *C23C 16/52*    (2006.01)
  *C23C 16/455*   (2006.01)

(52) U.S. Cl.
  CPC .............. *C23C 16/52* (2013.01); *C23C 16/24* (2013.01); *C23C 16/45512* (2013.01); *C23C 16/45593* (2013.01)

(58) Field of Classification Search
  CPC ................................ C23C 16/24; C23C 16/52
  See application file for complete search history.

(56) References Cited

U.S. PATENT DOCUMENTS 3,900,660 A * 8/1975 Bradley .................. C23C 16/24
                                              148/DIG. 122
4,125,643 A * 11/1978 Reuschel .............. C01B 33/035
                                              117/86

(Continued)

FOREIGN PATENT DOCUMENTS

JP          2519080 B2    5/1996
JP        2001146499 A    5/2001

(Continued)

OTHER PUBLICATIONS

Japanese Patent No. 2001146499; Date of Publication: May 29, 2001; Abstract Only, 2 pages.

(Continued)

*Primary Examiner* — David P Turocy
(74) *Attorney, Agent, or Firm* — Cantor Colburn LLP

(57) ABSTRACT

A method of improving polycrystalline silicon growth in a reactor, including: introducing a chlorosilane feed composition comprising trichlorosilane and dichlorosilane into a deposition chamber, wherein the deposition chamber contains a substrate; blending the chlorosilane feed composition with hydrogen gas to form a feed composition; adjusting a baseline flow of chlorosilane and hydrogen gas into the deposition chamber to achieve a pre-determined total flow and a pre-determined chlorosilane feed composition set point; applying pressure to the deposition chamber and energy to the substrate in the deposition chamber to form polycrystalline silicon; measuring the amount of dichlorosilane present in the chlorosilane feed composition and determining an offset value from a target value of dichlorosilane present in the chlorosilane feed composition; adjusting the chlorosilane feed composition set point by an amount inversely proportional to the dichlorosilane offset value; and depositing the formed polycrystalline silicon onto the substrate.

12 Claims, 4 Drawing Sheets

(56) References Cited

U.S. PATENT DOCUMENTS

| | | | |
|---|---|---|---|
| 4,491,604 A | | 1/1985 | Lesk et al. |
| 4,559,219 A | * | 12/1985 | Herrick .................. C01B 33/03 423/348 |
| 5,118,485 A | | 6/1992 | Arvidson et al. |
| 5,869,017 A | | 2/1999 | Oda |
| 8,398,946 B2 | * | 3/2013 | Hertlein ................ C01B 33/035 117/13 |
| 8,551,580 B2 | * | 10/2013 | Urushihara ........... C01B 33/035 427/255.393 |
| 2010/0150809 A1 | | 6/2010 | Bill, Jr. et al. |

FOREIGN PATENT DOCUMENTS

| | | | |
|---|---|---|---|
| WO | 2010135105 A1 | | 11/2010 |
| WO | WO-2010135105 A1 | * | 11/2010 ........... C01B 33/027 |
| WO | 2011084427 A2 | | 7/2011 |
| WO | 2013094855 A1 | | 6/2013 |

OTHER PUBLICATIONS

Japanese Patent No. 2519080; Date of Publication: Jul. 31, 1996; Abstract Only, 1 page.

Japanese Office Action for the corresponding Japanese Application No. 2016-163395; dated Aug. 17, 2020; English translation, 3 pages.

* cited by examiner

DICHLOROSILANE COMPENSATING CONTROL STRATEGY FOR IMPROVED POLYCRYSTALLINE SILICON GROWTH

TECHNICAL FIELD

Disclosed herein is a method of improving polycrystalline silicon growth in a reactor.

BACKGROUND

High purity semiconductor grade silicon is typically prepared by the "Siemens" process where trichlorosilane ($HSiCl_3$ or TCS) gas is reduced in the presence of hydrogen and deposited onto a heated silicon element. In such a process, only a minor fraction of the silicon feed as TCS is deposited as elemental silicon, with the remainder exiting the reactor as an effluent gas typically comprising greater than 50 mole percent (mol %) unreacted TCS, 5-15 mol % dichlorosilane ($H_2SiCl_2$ or DCS) formed as part of an equilibrium reaction, 35-45 mol % tetrachlorosilane ($SiCl_4$ or STC) formed by the chlorination of TCS during deposition of silicon, up to about 1 mol % chlorosilane ($H_3SiCl$), silane ($SiH_4$), disilane ($Si_2H_6$), and chlorodisilanes, and particulate silicon. Hydrogen is also produced in the reaction.

In a typical chemical vapor deposition (CVD) process, the effluent gas is then separated by condensation and subsequent distillation into a low boiling fraction comprising dischlorosilane (DCS) and TCS, and a high boiling fraction consisting primarily of STC. The high boiling fraction is then further processed in an additional step to separate the bulk of the STC from the other components. This recovered STC can then be hydrogenated to form TCS, which is then recycled to the CVD reactor. The remaining components of the high-boiling fraction comprising disilane, chlorodisilanes, and particulate silicon can be further processed to crack the disilanes (hereinafter "disilane(s)" refers to compounds described by the formula $H_nCl_{6-n}Si_2$, where n has a value of 0 to 6) and to separate the particulate silicon therefrom.

The amount of dichlorosilane (DCS) present in the reactor effluent varies as a function of growth conditions such as Si conversion which changes as the batch progresses. Since a typical polysilicon production plant consists of numerous reactors, whose effluent is combined for further processing, the DCS fraction in the resulting recycled TCS is difficult to predict and control. This is further complicated by other factors required in a complex chemical process operation such as inventory management, dynamic overall production rates and distillation control. These complexities, along with the significantly higher reactivity of DCS compared to TCS, limit the effectiveness of site wide polysilicon plant control measures in minimizing variation in decomposition reactor performance.

SUMMARY

A method of improving polycrystalline silicon growth in a reactor, comprises: introducing a chlorosilane feed composition comprising trichlorosilane and dichlorosilane into a deposition chamber, wherein the deposition chamber contains a substrate; blending the chlorosilane feed composition with hydrogen gas to form a feed composition; adjusting a baseline flow of chlorosilane and hydrogen gas into the deposition chamber to achieve a pre-determined total flow and a pre-determined chlorosilane feed composition set point; applying pressure to the deposition chamber and energy to the substrate in the deposition chamber to form polycrystalline silicon; measuring the amount of dichlorosilane present in the chlorosilane feed composition and determining an offset value from a target value of dichlorosilane present in the chlorosilane feed composition; adjusting the chlorosilane feed composition set point by an amount inversely proportional to the dichlorosilane offset value; and depositing the formed polycrystalline silicon onto the substrate.

BRIEF DESCRIPTION OF THE DRAWINGS

The following is a brief description of the drawings wherein like elements are numbered alike and which are exemplary of the various embodiments described herein.

DETAILED DESCRIPTION

Figure 1:
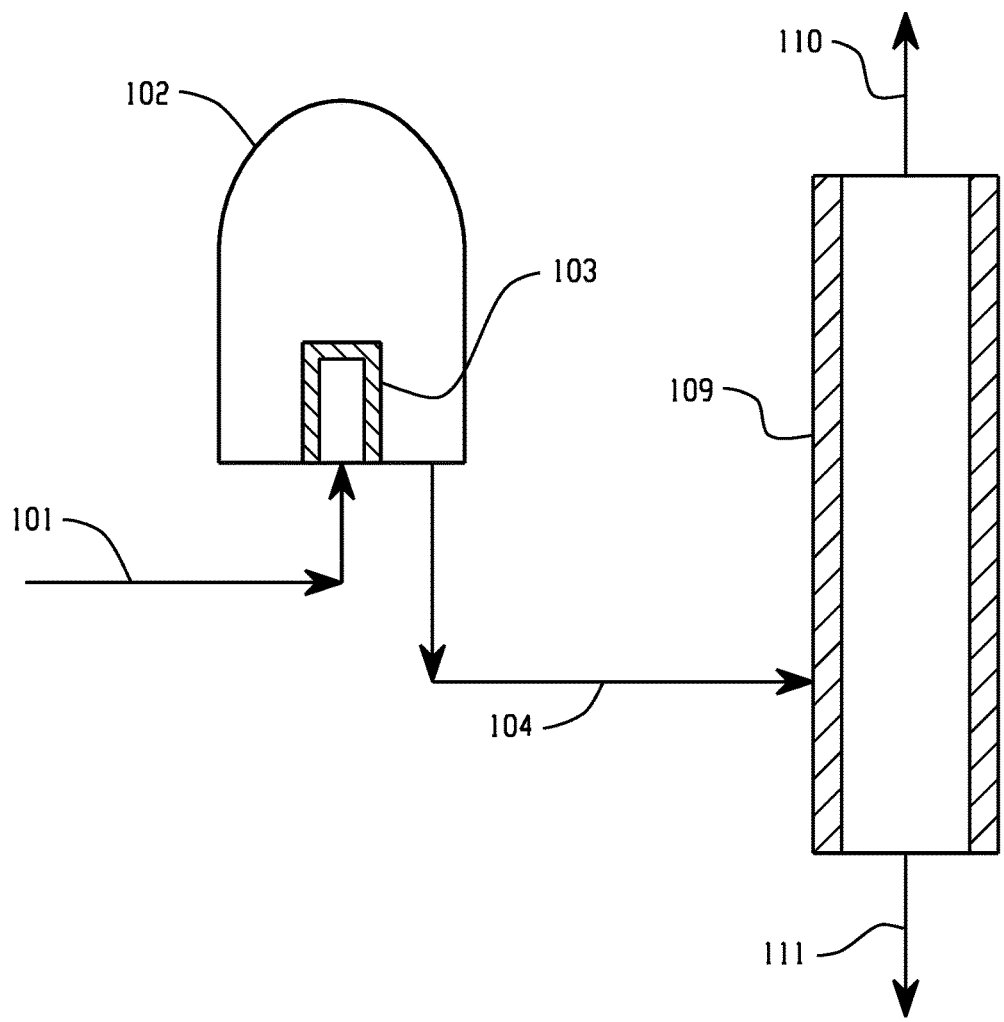
FIG. 1 is a schematic representation of a Siemens reactor with a recovery system.

Disclosed herein is a method of improving polycrystalline silicon growth in a reactor. During polycrystalline silicon growth in a reactor, the overall level of dichlorosilane present in the plant and reactor feeds can vary. Since dichlorosilane is more reactive than trichlorosilane, variations in the amount of dichlorosilane present in the reactor feed can cause variation in the decomposition process as the concentration of dichlorosilane in the chlorosilane feed mixture varies. This can result in production inefficiencies and can even sometimes result in a lower grade of polycrystalline silicon or an atypical polycrystalline silicon product. Accordingly, it can be desirable to compensate for variations in dichlorosilane to maintain consistent reactor performance.

The growth rate of polycrystalline silicon in reactors can be dependent upon several factors including, but not limited to, reaction temperature, total feed flow, and chlorosilane mol % in hydrogen. A chlorosilane feed to be introduced into a reactor can contain trichlorosilane and dichlorosilane. Changes in the ratio of dichlorosilane to trichlorosilane is generally not a controllable factor and can interfere with the decomposition process because dichlorosilane is more reactive than trichlorosilane and can influence the decomposition reaction rate as the amount of dichlorosilane present in the chlorosilane feed varies. For example, if the amount of dichlorosilane becomes either too large a part of the chlorosilane feed or if the dichlorosilane has a variable level during the course of a reactor run, the uniformity of the polycrystalline silicon growth rate can be affected. Surprisingly, even small amounts of variation, for example less than +/−1 mol % DCS in TCS can affect instantaneous growth rates, gas phase nucleation, and therefore overall reactor performance. Reactors are typically controlled via recipes with flow, TCS composition, and electrical energy input set to baseline values that vary as a function of runtime. While feedback adjustments are typically made for offsets such rod temperature, the reactivity of the feed is generally assumed to be constant so any variation around a baseline assumption has potential to negatively impact reactor performance. High and/or variable dichlorosilane levels can influence dust formation in the gas phase, leading to difficulties in maintaining desired gas temperatures, shortening batch times, and overall productivity. High and/or variable dichlorosilane levels can be associated with a lower grade polycrystalline silicon product manifested by uneven and/or porous silicon growth. High and/or variable dichlorosilane levels can be associated with an atypical surface on the polycrystalline silicon illustrated by the presence of localized atypical growth phenomena such as dendrites.

Disproportionation of effluent chlorosilanes in redistribution reactors can be utilized to attempt to suppress variation in DCS levels. This approach, however, has drawbacks in that it either cannot take into account or has too slow of a response time to adjust for changes in the many variables that are encountered in typical chemical plant operations. For example, polysilicon plants of any practical scale generally include numerous reactors, multiple condensation trains, storage tanks, centralized distillation systems and blends of fresh and recycled TCS feeds. Variation within these systems, for example, variations in condensation train temperatures and redistribution reaction control will impact DCS levels. Manipulating these many variables to control DCS levels while maintaining other functional requirements can become exceedingly complex and likely will not be able to deliver the precise control required for stable reactor operation. Another possible approach is to attempt to adjust DCS levels by blending of a DCS rich feed source to control composition. This approach would require separation, storage, and delivery of this alternate source, requiring additional capital investment and complexity. Another option yet would be to separate DCS from TCS altogether, but this would also require additional capital investment and would generate a concentrated DCS waste stream to process, resulting in both safety concerns and economic penalty. The method disclosed herein addresses these shortcomings and eliminates the variation caused by variable DCS levels without the need for significant capital investment and with minimal complexity.

It was discovered that implementation of a control strategy to compensate for changes in reactor feed dichlorosilane levels at the decomposition reactor can decrease or eliminate the impact of this variability on polysilicon deposition and overall reactor performance, thereby reducing or eliminating the need for complex DCS control methodologies. For example, adjusting the reactor feed chlorosilane mol % inversely proportional to the deviation of the reactor dichlorosilane level from a target level by means of a correlation coefficient can result in a reduced variability in key performance characteristics of all reactors in a polysilicon production plant. A correlation coefficient can be calculated from historical data from the various reactors in the plant as well as experimental runs. The correlation coefficient can be adjusted on individual reactors to accommodate metering errors or other attributes unique to a given reactor.

Maintaining a constant chlorosilane feed reactivity can reduce run to run variability since a constant polycrystalline silicon growth rate profile can be maintained. Additionally, with the overall dichlorosilane level and variability no longer concerns, redistribution systems and/or complex DCS control methodologies are no longer necessary, thereby simplifying overall polysilicon plant operation.

As illustrated in FIG. 1, a chlorosilane feed gas stream 101 can be fed to a Siemens reactor 102 containing a substrate, e.g., 1 or more U-rods. The chlorosilane feed gas stream 101 can comprise trichlorosilane and dichlorosilane, and potentially hydrogen. The U-rod can comprise two polycrystalline silicon seed rods connected together by a polycrystalline silicon bridge. Polycrystalline silicon can be deposited from the feed gas stream 101 onto the U-rod to produce polycrystalline silicon product in rod form 103. The product in rod form 103 can be removed from the Siemens reactor 102 at the end of a batch. The vent gas stream 104 from the Siemens reactor can comprise dichlorosilane, trichlorosilane, silicon tetrachloride, hydrogen, hydrogen chloride, disilanes, and silicon powder.

The vent gas stream 104 can be sent to recovery system 109. Hydrogen can be recovered and sent back to the Siemens reactor 102 through line 110. Chlorosilanes can be recovered through line 111 and recycled or sold. Hydrogen chloride can be recovered and sold. Silicon tetrachloride can be hydrogenated or otherwise converted to trichlorosilane, and the resulting trichlorosilane can be recycled to the Siemens reactor 102.

The chlorosilane feed to the decomposition reactors generally contains trichlorosilane (TCS) and dichlorosilane (DCS) diluted in hydrogen. Dichlorosilane is much more reactive than trichlorosilane and can cause variation in the decomposition process as its concentration in the chlorosilane feed mixture varies. Reactor feed conditions can be set to a nominal value of dichlorosilane present, for example 5% and any variation around that nominal value can lead to variation in reactor performance as previously described herein. Lower dichlorosilane levels can reduce deposition rates and increase operating costs. Higher dichlorosilane levels can result in shortened run times due to dust formation in the gas phase, a lower grade polysilicon product demonstrated by uneven, porous silicon growth, and an atypical surface.

Dichlorosilane remains a part of the chlorosilane feed because it is difficult to fully separate from trichlorosilane due to similar boiling points between the two. Additionally, having at least some dichlorosilane in the feed to the decomposition reactor can be beneficial. The greater reactivity of dichlorosilane compared to trichlorosilane can improve productivity and lower energy consumption, which in turn can lower the overall cost of producing polysilicon.

Redistribution systems can be used to influence plant DCS composition, but for reasons described previously cannot provide the level of control required to effectively control the impact on silicon decomposition and therefore reactor productivity. Accordingly, the methods disclosed herein were developed to consider these issues and to develop a process for reducing the impact of variation in the amount of dichlorosilane present in the chlorosilane feed composition.

The method disclosed herein can more effectively reduce feed composition induced variation, thereby simplifying troubleshooting efforts. Overall basis for the method is to keep the overall reactivity of the feed material constant, despite variable DCS composition. The method disclosed herein can adjust the chlorosilane mol % in the reactor feed inversely proportional to the dichlorosilane level using an empirically derived correlation coefficient. In other words, as the dichlorosilane level increases, the chlorosilane feed to the reactor can be reduced. Likewise, as the dichlorosilane level decreases, the chlorosilane feed to the reactor can be increased. The correlation coefficient can be calculated from historical data from the reactors and from plant trials.

The method of improving polycrystalline silicon growth in a reactor can include introducing a chlorosilane feed composition comprising trichlorosilane and dichlorosilane into a deposition chamber. The deposition chamber generally contains a substrate. A feed composition can be formed by blending the chlorosilane feed with hydrogen gas. A baseline flow of chlorosilane and hydrogen gas into the deposition chamber can be adjusted to achieve a pre-determined total flow and a pre-determined chlorosilane feed composition set point, which can be set as a function of runtime and fixed by recipe. Pressure can then be applied to the deposition chamber and energy can be applied to the substrate in the deposition chamber to form polycrystalline silicon. The amount of dichlorosilane present in the chlorosilane feed composition can be measured and then an offset value from a target value of dichlorosilane present in the chlorosilane feed composition can be determined. The chlorosilane feed composition set point can be adjusted by an amount inversely proportional to the dichlorosilane offset value. The formed polycrystalline silicon can then be deposited onto the substrate with less variability and without the need for additional instrumentation or feed sources.

Depositing the formed polycrystalline silicon onto the substrate can be accomplished by a vapor deposition method selected from chemical vapor deposition, atmospheric pressure chemical vapor deposition, high pressure chemical vapor deposition, hot filament chemical vapor deposition, hybrid physical-chemical vapor deposition, and rapid thermal chemical vapor deposition.

The pressure in the deposition chamber can be greater than or equal to 0.5 kiloPascals (kPa), for example 300-1000 kPa. The gas temperature within the deposition chamber can be less than or equal to 750° C., for example 500-750° C. The substrate temperature within the deposition chamber can be greater than or equal to 900° C., for example, greater than or equal to 1,000° C., for example, less than or equal to 1,200° C.

In an embodiment, the method can include predetermining the total flow, chlorosilane feed composition, and electrical energy set points as a function of batch runtime. The total flow and chlorosilane feed composition set points can be dynamically adjusted to maintain an aggregate gas temperature in the deposition chamber below a predetermined threshold value. For example the aggregate gas temperature can be maintained at temperatures below 750° C. The predetermined threshold value can be calculated from historical data or set by mechanical integrity limitations of the reactor system. The amount of energy applied to the substrate can be adjusted by adjusting energy input coinciding with the chlorosilane feed flow via another correlation constant.

The proportionality constant for determining the optimal feed adjustment can be estimated to maintain the percentage of silicon to hydrogen (% Si—H) and then further adjusted from historical reactor data and experimental trials. For example, the proportionality constant can be determined by comparing reactor performance data from runs with different TCS feed composition set points which can coincide with high or low relative levels of DCS. By comparing runs with similar growth profiles but different combinations of TCS feed set points and DCS compositions, an empirical relationship between TCS mol % and DCS mol % can be generated. This constant can be further refined by manipulating DCS levels and TCS mol % set point offsets in a controlled manner to build the same correlation. A plot of TCS mol % offset as a function of DCS offset yields a straight line relationship, the slope of which determines the proportionality constant.

The chlorosilane feed composition can contain 1 mol % to 15 mol % dichlorosilane, for example, 4.5 mol % to 15 mol % dichlorosilane, for example, 3 mol % to 10 mol % dichlorosilane. The amount of chlorosilane composition set point adjustment can be determined by a proportionality constant, which can be determined as described previously. To enable real time responses to fluctuations in the amount of dichlorosilane present, the amount of dichlorosilane present in the chlorosilane feed composition can be continuously measured during a batch run of the reactor. This can either be measured locally or in a common feed system using methods such as liquid chromatography, gas chromatography, or Raman spectroscopy. Continuous measurement of the amount of dichlorosilane present in the chlorosilane feed enables continuous adjustment of feed composition in order to maintain constant reactivity despite variation in DCS composition.

The chlorosilane feed can be pre-blended with hydrogen. The pre-blended chlorosilane feed composition can contain 5 to 65 mol % hydrogen, for example, 10 to 55 mol % hydrogen, for example, 25 to 45 mol % hydrogen.

The methods disclosed herein can decrease batch to batch variation in deposition rate of polycrystalline silicon on the substrate in the deposition chamber as compared to a deposition chamber that does not account for variations in the amount of dichlorosilane present in the chlorosilane feed composition. The methods disclosed herein can reduce batch to batch variation in reactor unit energy consumption during polycrystalline silicon growth on the substrate in the deposition chamber as compared to the reactor unit energy consumption during polycrystalline silicon grown on a substrate in a deposition chamber not accounting for variations in the amount of dichlorosilane present in the chlorosilane feed composition. The methods disclosed herein can reduce batch to batch variation in conversion of chlorosilane feed composition into polycrystalline silicon on the substrate in the deposition chamber as compared to a deposition chamber not accounting for variations in the amount of dichlorosilane present in the chlorosilane feed composition. The methods disclosed herein can reduce batch to batch variation in time to reach a specified threshold temperature in the deposition chamber as compared to a deposition chamber not accounting for variations in the amount of dichlorosilane present in the chlorosilane feed composition.

EXAMPLES

Example 1: Correlation Between Unit Energy Consumption and DCS

Figure 2:
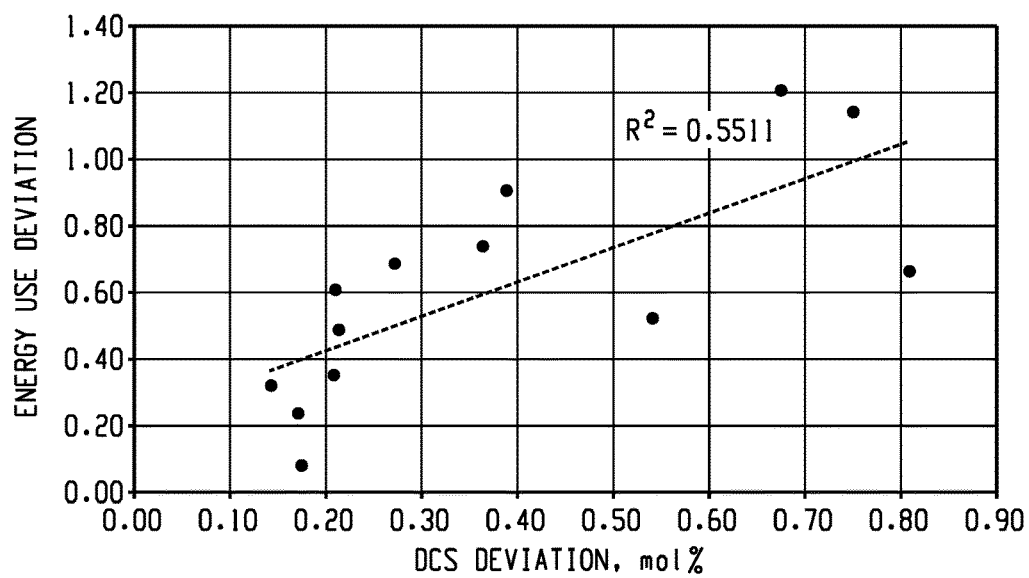
FIG. 2 is a graphical representation of reactor energy consumption deviation versus DCS deviation in a deposition chamber without the process disclosed herein for improving polycrystalline silicon growth in a reactor.
Figure 3:
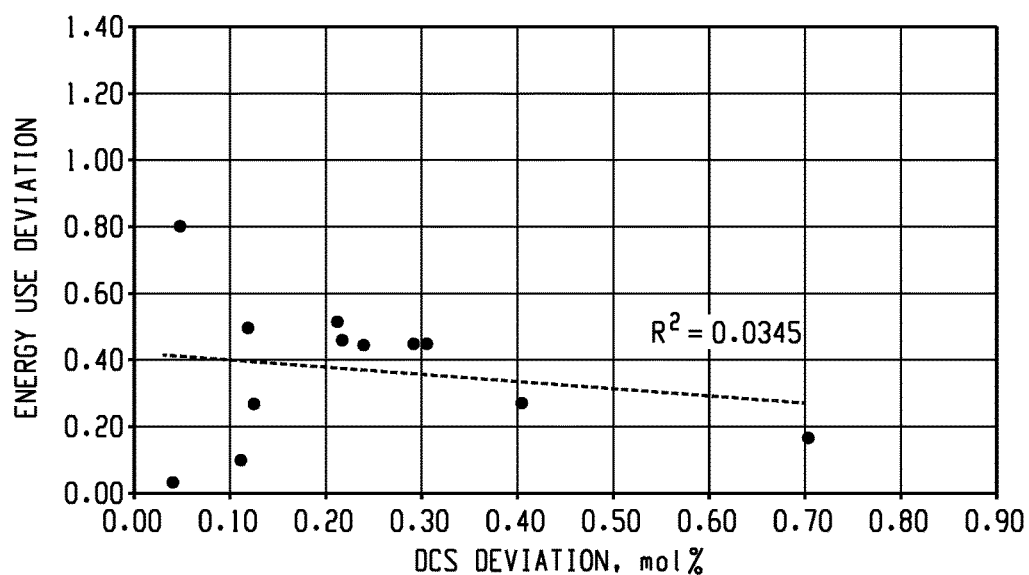
FIG. 3 is a graphical representation of reactor energy consumption deviation versus DCS deviation in a deposition chamber with the process disclosed herein for improving polycrystalline silicon growth in a reactor.

In this example, the amount of dichlorosilane (DCS) deviation and unit energy consumption deviation present in a deposition chamber was measured in a deposition chamber that did not utilize the method of improving polycrystalline silicone growth in a reactor and was also measured in a deposition chamber that utilized the method of improving polycrystalline silicone growth in a reactor as disclosed herein. The results are illustrated in FIGS. 2 and 3, where unit energy consumption deviation, measured in kilowatt hours per kilogram (kWh/kg) is plotted against the DCS deviation, measured in mole percent (mol %). In FIGS. 2 and 3, the absolute deviation for each batch is illustrated as compared to the mean value for all of the batches. As can be seen in FIGS. 2 and 3, when using the presently claimed method, unit energy consumption deviation decreases relative to any DCS deviation. Stated another way, unit energy consumption deviation is effectively decoupled (i.e., become independent) from DCS deviation.

Example 2: Correlation Between Conversion and DCS

Figure 4:
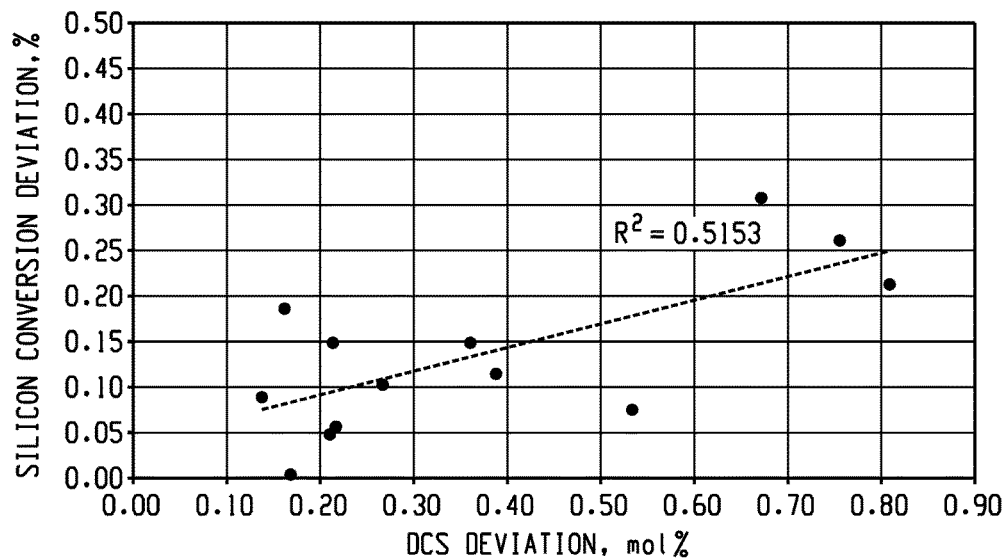
FIG. 4 is a graphical representation of silicon conversion deviation versus DCS deviation in a deposition chamber without the process disclosed herein for improving polycrystalline silicon growth in a reactor.
Figure 5:
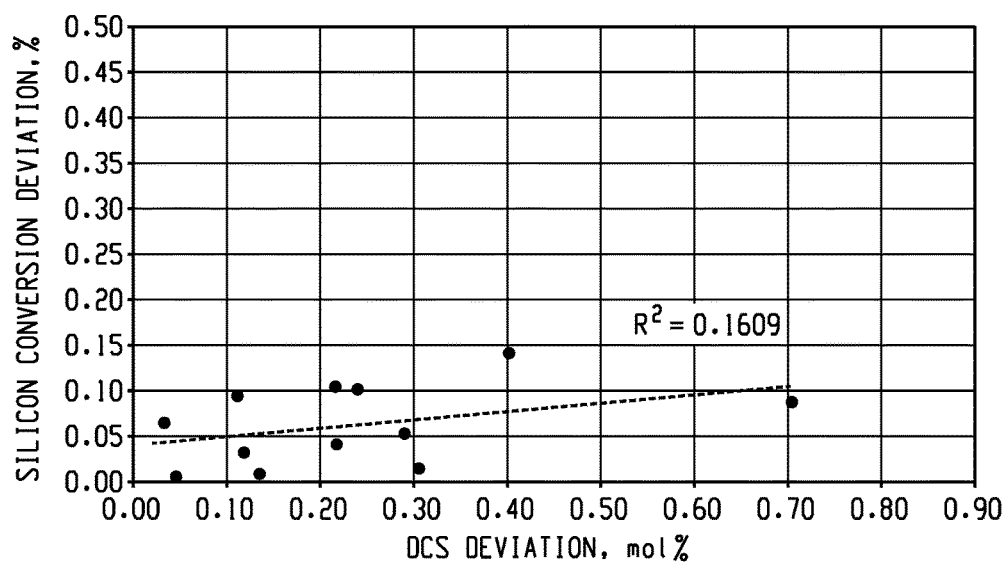
FIG. 5 is a graphical representation of silicon conversion deviation versus DCS deviation in a deposition chamber with the process disclosed herein for improving polycrystalline silicon growth in a reactor.

In this example, the amount of dichlorosilane (DCS) deviation and silicon conversion deviation present in a deposition chamber was measured in a deposition chamber that did not utilize the method of improving polycrystalline silicone growth in a reactor and was also measured in a deposition chamber that utilized the method of improving polycrystalline silicone growth in a reactor as disclosed herein. The results are illustrated in FIGS. 4 and 5, where silicon conversion deviation, measured in percent (%) is plotted against the DCS deviation measured in mole percent (mol %). In FIGS. 4 and 5, the absolute deviation for each batch is illustrated as compared to the mean value for all of the batches. As can be seen in FIGS. 4 and 5, when using the presently claimed method, silicon conversion deviation decreases relative to any DCS deviation.

Figure 6:
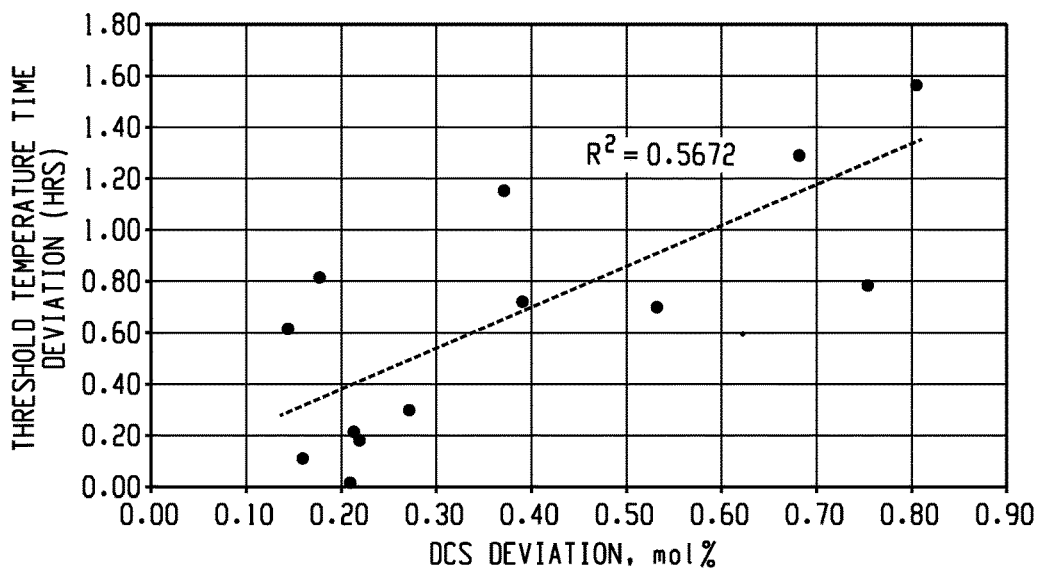
FIG. 6 is a graphical representation of threshold temperature time deviation versus DCS deviation in a deposition chamber without the process disclosed herein for improving polycrystalline silicon growth in a reactor.
Figure 7:
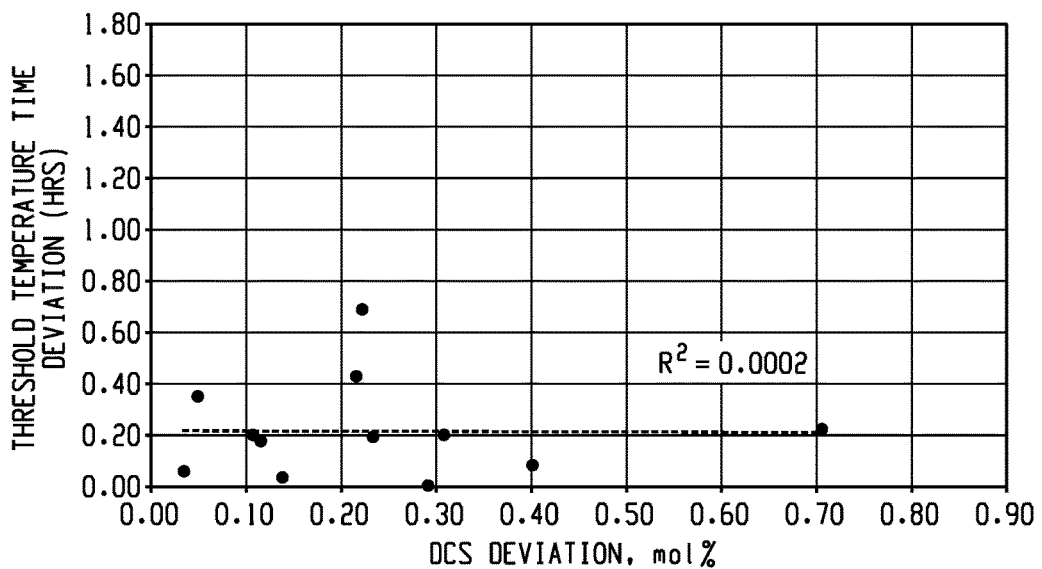
FIG. 7 is a graphical representation of threshold temperature time deviation versus DCS deviation in a deposition chamber with the process disclosed herein for improving polycrystalline silicon growth in a reactor.

Example 3: Correlation Between Time at which the Maximum Gas Threshold Temperature is Reached and DCS In this example, the amount of dichlorosilane (DCS) deviation and time deviation to when the threshold gas temperature is reached was measured in a deposition chamber that did not utilize the method of improving polycrystalline silicone growth in a reactor and was also measured in a deposition chamber that utilized the method of improving polycrystalline silicone growth in a reactor as disclosed herein. It is noted that the time at which the threshold gas temperature is reached is primarily an indication of a specific rod diameter. Accordingly, deviations in this time are indicative of an offset in the average rod growth from the target profile. The results are illustrated in FIGS. 6 and 7, where time deviation, measured in hours (hrs) is plotted against the DCS deviation, measured in mole percent (mol %). In FIGS. 6 and 7, the absolute deviation for each batch is illustrated as compared to the mean value for all of the batches. As can be seen in FIGS. 6 and 7, when using the presently claimed method, time deviation decreases relative to any DCS deviation.

The methods disclosed herein include at least the following embodiments:

Embodiment 1

A method of improving polycrystalline silicon growth in a reactor, comprises: introducing a chlorosilane feed composition comprising trichlorosilane and dichlorosilane into a deposition chamber, wherein the deposition chamber contains a substrate; blending the chlorosilane feed composition with hydrogen gas to form a feed composition; adjusting a baseline flow of chlorosilane and hydrogen gas into the deposition chamber to achieve a pre-determined total flow and a pre-determined chlorosilane feed composition set point; applying pressure to the deposition chamber and energy to the substrate in the deposition chamber to form polycrystalline silicon; measuring the amount of dichlorosilane present in the chlorosilane feed composition and determining an offset value from a target value of dichlorosilane present in the chlorosilane feed composition; adjusting the chlorosilane feed composition set point by an amount inversely proportional to the dichlorosilane offset value; and depositing the formed polycrystalline silicon onto the substrate.

Embodiment 2

The method of Embodiment 1, wherein measuring the amount of dichlorosilane present in the chlorosilane feed composition further comprises determining an offset value from a target value of dichlorosilane present in the chlorosilane feed composition.

Embodiment 3

The method of Embodiment 2, wherein the chlorosilane feed composition set point is adjusted by an amount inversely proportional to the dichlorosilane offset value.

Embodiment 4

The method of any of Embodiments 1-3, wherein depositing the formed polycrystalline silicon onto the substrate is accomplished by a chemical vapor deposition method selected from chemical vapor deposition, atmospheric pressure chemical vapor deposition, high pressure chemical vapor deposition, hot filament chemical vapor deposition, hybrid physical-chemical chemical vapor deposition, and rapid thermal chemical vapor deposition.

Embodiment 5

The method of any of Embodiments 1-4, wherein the pressure in the deposition chamber is greater than or equal to 0.5 Pascals.

Embodiment 6

The method of any of Embodiments 1-5, wherein the gas temperature within the deposition chamber is less than or equal to 750° C.

Embodiment 7

The method any of Embodiments 1-6, wherein the substrate temperature is greater than or equal to 900° C.

Embodiment 8

The method of any of Embodiments 1-7, further comprising predetermining the total flow and chlorosilane feed composition set points as a function of batch runtime.

Embodiment 9

The method of any of Embodiments 1-8, further comprising adjusting the total flow and chlorosilane feed composition set points to maintain a gas temperature in the deposition chamber below a predetermined threshold value.

Embodiment 10

The method of any of Embodiments 1-9, further comprising adjusting the amount of energy applied to the substrate as a function of chlorosilane feed composition flow.

Embodiment 11

The method of any of Embodiments 1-9, wherein the chlorosilane feed composition contains 1 to 15 mol % dichlorosilane.

Embodiment 12

The method of Embodiment 11, wherein the chlorosilane feed composition contains 3 to 10 mol % dichlorosilane.

Embodiment 13

The method of any of Embodiments 1-12, wherein the amount of chlorosilane composition set point adjustment is determined by a proportionality constant.

Embodiment 14

The method of Embodiment 13, wherein the proportionality constant is based upon historical data gathered from the deposition chamber.

Embodiment 15

The method of Embodiment 13 or Embodiment 14, wherein the proportionality constant is based upon experimental runs of the deposition chamber.

Embodiment 16

The method of any of Embodiments 1-15, wherein the amount of dichlorosilane present in the chlorosilane feed composition is continuously measured during a batch run of the reactor.

Embodiment 17

The method of any of Embodiments 1-16, wherein the chlorosilane feed composition is pre-blended with hydrogen.

Embodiment 18

The method of Embodiment 17, wherein the pre-blended chlorosilane feed composition contains 10-55 mol % hydrogen.

Embodiment 19

The method of any of Embodiments 1-18, wherein batch to batch variation in deposition rate of polycrystalline silicon on the substrate grown in the deposition chamber is less than that grown in a deposition chamber not accounting for variations in the amount of dichlorosilane present in the chlorosilane feed composition.

Embodiment 20

The method of any of Embodiments 1-19, wherein batch to batch variation in reactor unit energy consumption during polycrystalline silicon growth on the substrate in the deposition chamber is less than the reactor unit energy consumption during polycrystalline silicon grown on a substrate in a deposition chamber not accounting for variations in the amount of dichlorosilane present in the chlorosilane feed composition.

Embodiment 21

The method of any of Embodiments 1-20, wherein batch to batch variation in conversion of chlorosilane feed composition into polycrystalline silicon on the substrate in the deposition chamber is less than that in a deposition chamber not accounting for variations in the amount of dichlorosilane present in the chlorosilane feed composition.

The singular forms "a," "an," and "the" include plural referents unless the context clearly dictates otherwise. "Or" means "and/or." The modifier "about" used in connection with a quantity is inclusive of the stated value and has the meaning dictated by the context (e.g., includes the degree of error associated with measurement of the particular quantity). The notation "±10%" means that the indicated measurement can be from an amount that is minus 10% to an amount that is plus 10% of the stated value. The endpoints of all ranges directed to the same component or property are inclusive and independently combinable (e.g., ranges of "less than or equal to 25 wt %, or 5 wt % to 20 wt %," is inclusive of the endpoints and all intermediate values of the ranges of "5 wt % to 25 wt %," etc.). Disclosure of a narrower range or more specific group in addition to a broader range is not a disclaimer of the broader range or larger group.

The suffix "(s)" is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. Unless defined otherwise, technical and scientific terms used herein have the same meaning as is commonly understood by one of skill in the art to which this invention belongs. A "combination" is inclusive of blends, mixtures, alloys, reaction products, and the like.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A method comprising:
   providing a reactor having a deposition chamber for deposition of polycrystalline silicon on a substrate from a composition comprising trichlorosilane, dichlorosilane and hydrogen;
   obtaining a proportionality constant for the reactor for determining optimal feed adjustment for the reactor from historical operation of the deposition chamber, experimental runs of the deposition chamber, or both comparing reactor performance data from runs with different trichlorosilane feed compositions and high or low relative levels of dichlorosilane;

introducing hydrogen and a chlorosilane feed to the deposition chamber, wherein the chlorosilane feed comprises trichlorosilane and an amount of dichlorosilane which varies;

measuring the amount of dichlorosilane in the chlorosilane feed;

adjusting an amount of the chlorosilane feed being introduced to the deposition chamber based on the measured amount of dichlorosilane in the chlorosilane feed and the proportionality constant; and depositing polycrystalline silicon on the substrate.

2. The method of claim 1, characterized by one or more of pressure in the deposition chamber is greater than or equal to 0.5 Pascals, gas temperature within the deposition chamber is less than or equal to 750° C., substrate temperature is greater than or equal to 900° C.

3. The method of claim 1, wherein the chlorosilane feed composition contains 1 to 15 mol % dichlorosilane.

4. The method of claim 1, wherein the amount of dichlorosilane present in the chlorosilane feed composition is continuously measured during a batch run of the reactor.

5. The method of claim 1, wherein the chlorosilane feed composition is pre-blended with hydrogen.

6. The method of claim 1, wherein the amount of hydrogen is 5 to 65 mol % based on total amount of hydrogen and chlorosilane feed.

7. The method of claim 1 wherein proportionality constant is the slope of trichlorosilane mol % offset as a function of dichlorosilane offset.

8. A method comprising:

providing a plurality of reactors each having a deposition chamber for deposition of polycrystalline silicon on a substrate;

combining effluent from the plurality of reactors and processing the effluent to form a recycle stream comprising dichlorosilane and trichlorosilane wherein a fraction of the dichlorosilane in the recycle stream varies;

blending a portion of the recycle stream with additional trichlorosilane to form a chlorosilane feed comprising chlorosilanes wherein the chlorosilanes in the feed are dichlorosilane and trichlorosilane and a fraction of the dichlorosilane in the chlorosilane feed varies;

blending an amount of the chlorosilane feed with an amount of hydrogen to form a feed composition having a mol % of the chlorosilanes in hydrogen introducing the feed composition to the deposition chamber of one or more of the plurality of reactors at a total flow for each reactor;

measuring the amount of dichlorosilane present in the chlorosilane feed and determining for each of the one or more of the plurality of reactors an offset value from a target value of dichlorosilane present in the chlorosilane feed for said each of the one or more of the plurality of reactors;

adjusting the chlorosilane feed mole percent of the total flow into the deposition chamber of each of the one or more of the plurality of reactors by an amount inversely proportional to the dichlorosilane offset value for said each of the one or more of the plurality of reactors; and depositing polycrystalline silicon onto the substrates in each of said one or more of the plurality of reactors.

9. The method of claim 8, characterized by one or more of pressure in the deposition chamber of each of the one or more of the plurality of reactors is greater than or equal to 0.5 Pascals, gas temperature within the deposition chamber of each of the one or more of the plurality of reactors is less than or equal to 750° C., substrate temperature is greater than or equal to 900° C.

10. The method of claim 8, wherein the chlorosilane feed contains 1 to 15 mol % dichlorosilane.

11. The method of claim 8, wherein the amount of dichlorosilane present in the chlorosilane feed composition is continuously measured during a batch run of the one or more of the plurality of reactors.

12. The method of claim 8, wherein the amount of hydrogen is 5 to 65 mol % based on total amount of hydrogen and chlorosilanes.

* * * * *